United States Patent
Clarysse et al.

(10) Patent No.: US 10,394,435 B2
(45) Date of Patent: Aug. 27, 2019

(54) METHOD FOR MANIPULATING A COMPUTER AIDED DESIGN (CAD) MODEL BY A DRAG OPERATION, A COMPUTER PROGRAM PRODUCT AND A SERVER THEREFORE

(71) Applicant: Menhirs NV, Ghent (BE)

(72) Inventors: Pieter Clarysse, Ghent (BE); Hans De Backer, Ghent (BE); Erik De Keyser, Ghent (BE); Luc De Batselier, Ghent (BE)

(73) Assignee: Bricsys NV, Ghent (BE)

( * ) Notice: Subject to any disclaimer, the term of this patent is extended or adjusted under 35 U.S.C. 154(b) by 142 days.

(21) Appl. No.: 15/516,776

(22) PCT Filed: Oct. 6, 2014

(86) PCT No.: PCT/EP2014/071358
§ 371 (c)(1),
(2) Date: Apr. 4, 2017

(87) PCT Pub. No.: WO2016/055091
PCT Pub. Date: Apr. 14, 2016

(65) Prior Publication Data
US 2017/0308276 A1   Oct. 26, 2017

(51) Int. Cl.
*G06T 19/20* (2011.01)
*G06F 3/01* (2006.01)
(Continued)

(52) U.S. Cl.
CPC .......... *G06F 3/04845* (2013.01); *G06F 17/50* (2013.01); *G06T 19/20* (2013.01)

(58) Field of Classification Search
None
See application file for complete search history.

(56) References Cited

U.S. PATENT DOCUMENTS

| | | | |
|---|---|---|---|
| 6,426,745 B1 | 7/2002 | Isaacs | |
| 6,771,260 B1 * | 8/2004 | Hazama | G06T 19/20 345/420 |

(Continued)

OTHER PUBLICATIONS

International Search Report and Written Opinion of the International Searching Authority for International Application No. PCT/EP2014/071358, dated Jun. 15, 2015, in 18 pages.

(Continued)

*Primary Examiner* — Nhat Huy T Nguyen
(74) *Attorney, Agent, or Firm* — James Creighton Wray (57) ABSTRACT

In a first aspect the present invention provides a method for manipulating a computer aided design (CAD) model, comprising the following computer-implemented steps of:
—creating a first solid entity in a CAD model, said first solid entity comprising one or more coordinates and a 3D volume;
—a user executing a drag operation on said first solid entity; wherein said drag operation comprises the following computer-implemented steps: a) selecting a face of said first solid entity; b) determining if said face is a major face or a minor face for said first solid entity; c) determining a drag direction; d) in case of a determined major face executing a moving operation on said first solid entity in said drag direction and in case of a determined minor face executing a push-pull operation on said selected face of said first solid entity in said drag direction. In a second and third aspect, the present invention relates to a computer program product and server for manipulating a computer aided design (CAD) model by a drag operation.

19 Claims, 9 Drawing Sheets

(51) Int. Cl.
*G06F 17/50* (2006.01)
*G06F 3/0484* (2013.01)

(56) References Cited

U.S. PATENT DOCUMENTS

2009/0125801 A1* 5/2009 Algreatly .............. G06F 3/0481
715/234
2009/0259442 A1 10/2009 Gandikota et al.
2015/0379063 A1* 12/2015 Sohn ...................... G06Q 10/10
707/638

OTHER PUBLICATIONS

Oh et al., "SESAME: Towards Better 3D Conceptual Design Systems," Proceedings of the 6th ACM Conference on Designing Interactive Systems, Jan. 1, 2006, New York, New York, pp. 80-89.
Stork et al., "Efficient and Precise Solid Modelling using a 3D Input Device," Proceedings of 4th ACM Siggraph Symposium on Solid Modeling and Applications, May 14-16, 1997, Atlanta, Georgia, pp. 181-194.
Anonymous: "Sweet Home 3D User's Guide" Aug. 17, 2014.
Anonymous: "Sweet Home 3D, Version History", Feb. 6, 2015.

* cited by examiner

METHOD FOR MANIPULATING A COMPUTER AIDED DESIGN (CAD) MODEL BY A DRAG OPERATION, A COMPUTER PROGRAM PRODUCT AND A SERVER THEREFORE

CROSS-REFERENCE TO RELATED APPLICATIONS

This application is the U.S. National Phase under 35 U.S.C. § 371 of International Application PCT/EP2014/071358, filed Oct. 6, 2014.

FIELD OF THE INVENTION

The present invention relates to a method, a computer program product and a server for manipulating a computer aided design (CAD) model by a drag operation.

BACKGROUND

CAD software applications provide users with the capability to create and edit geometry, models and drawings using actions or commands. Typical CAD software applications are AutoCAD, Inventor, Solidworks, Spaceclaim, BricsCAD, etc.

Historically, these actions were launched from menus and toolbar buttons or command prompts which were placed at static locations on the screen. As a result, these actions were not always handy, i.e. near the present location of the cursor.

Furthermore a set of tools can be provided into a 'context menu', that pops up near the cursor thereby reducing the time taken to access the commands. This context menu typically can be invoked either by explicit user action like a right click, or by the software calculating if there is an entity of interest under the cursor and automatically invoking it.

Problem with these methods is that too often a user needs to explicitly designate the user action or operation which the user wants to execute. Often the user needs to switch between the same basic operations, which increases designing time.

There is a need for a CAD model manipulating method which provides a basic manipulation operation for entities, which provides and executes more relevant user actions, which increases productivity by reducing time for a user to manipulate entities of a CAD model.

SUMMARY

The present invention provides in one embodiment, a method for manipulating a computer aided design (CAD) model, comprising the following computer-implemented steps of:
  creating a first solid entity in a CAD model, said first solid entity comprising one or more coordinates and a 3D volume;
  a user executing a drag operation on said first solid entity;
  wherein said drag operation comprises the following computer-implemented steps:
    a) selecting a face of said first solid entity;
    b) determining if said face is a major face or a minor face for said first solid entity;
    c) determining a drag direction;
    d) in case of a determined major face executing a moving operation on said first solid entity in said drag direction and in case of a determined minor face executing a push-pull operation on said selected face of said first solid entity in said drag direction, as described in claim 1.

It is advantageous as this greatly increases productivity by reducing the time taken to switch between a moving and a push-pull operation. In case of e.g. wall objects, often the user intends to move a wall when selecting the largest wall face, and when selecting a smaller side face intends to stretch or push-pull said face, making said wall wider or narrower. Said drag operation reduces time and clicks taken to provide or execute the correct operation on a solid object.

In a second aspect the present invention provides a computer program product for manipulating a computer aided design (CAD) model, said computer program product comprising at least one computer-readable storage medium having computer-readable program code portions stored therein, the computer-readable program code portions comprising instructions for:
  creating a first solid entity in a CAD model, said first solid entity comprising one or more coordinates and a 3D volume;
  a user executing a drag operation on said first solid entity;
  wherein said drag operation comprises the following computer-implemented steps:
    a) selecting a face of said first solid entity;
    b) determining if said face is a major face or a minor face for said first solid entity;
    c) determining a drag direction;
    d) in case of a determined major face executing a moving operation on said first solid entity in said drag direction and in case of a determined minor face executing a push-pull operation on said selected face of said first solid entity in said drag direction.

In a third aspect the present invention provides a server for manipulating a computer aided design (CAD) model using a computing device connected to the server via a network, the server comprising:
  an input receiving module, the input receiving module configured to receive user input for a drag operation on one or more solid entities in a CAD model set forth by the user;
  at least one processor, the at least one processor configured to:
    creating a first solid entity in a CAD model, said first solid entity comprising one or more coordinates and a 3D volume;
    a user executing a drag operation on said first solid entity;
  wherein said drag operation comprises the following computer-implemented steps:
    a) selecting a face of said first solid entity;
    b) determining if said face is a major face or a minor face for said first solid entity;
    c) determining a drag direction;
    d) in case of a determined major face executing a moving operation on said first solid entity in said drag direction and in case of a determined minor face executing a push-pull operation on said selected face of said first solid entity in said drag direction.

While multiple embodiments are disclosed, still other embodiments of the present invention will become apparent to those skilled in the art from the following detailed description, which shows and describes illustrative embodiments of the invention. As will be realized, the invention is capable of modifications in various obvious aspects, all without departing from the spirit and scope of the present invention. Accordingly, the drawings and detailed description are to be regarded as illustrative in nature and not restrictive.

DESCRIPTION OF THE FIGURES

Further features, advantages and objects of the present invention will become apparent for the skilled person when reading the following detailed description of embodiments of the present invention, when taken in conjunction with the figures of the enclosed drawings.

DETAILED DESCRIPTION OF THE INVENTION

The present invention relates to a method, a computer program product and a server for manipulating a computer aided design (CAD) model by a drag operation. Unless otherwise defined, all terms used in disclosing the invention, including technical and scientific terms, have the meaning as commonly understood by one of ordinary skill in the art to which this invention belongs. By means of further guidance, term definitions are included to better appreciate the teaching of the present invention.

"A", "an", and "the" as used herein refers to both singular and plural referents unless the context clearly dictates otherwise. By way of example, "an entity" refers to one or more than one entity.

"Comprise," "comprising," and "comprises" and "comprised of" as used herein are synonymous with "include", "including", "includes" or "contain", "containing", "contains" and are inclusive or open-ended terms that specifies the presence of what follows e.g. component and do not exclude or preclude the presence of additional, non-recited components, features, element, members, steps, known in the art or disclosed therein.

The recitation of numerical ranges by endpoints includes all numbers and fractions subsumed within that range, as well as the recited endpoints.

The term "computer aided design (CAD) model" in underlying invention is to be understood as a model or drawing wherein lines, curves, surfaces and solids can be created and manipulated in a three-dimensional (3D) space.

The term "solid entity" in underlying invention is to be understood as a graphical entity or object with a 3D volume and defining faces. Typically said entity could have a parallelepiped shape, with plane faces. Note that other shapes are also to be understood, such as 3D volumes with curved faces, with holes, etc.

The term "adjacent face" in underlying invention is to be understood as a connected or coplanar face from a neighbouring solid entity.

The term "moving operation" in underlying invention is to be understood as an operation wherein a 3D solid entity is displaced as a whole.

The term "push-pull operation" or "press-pull operation" in underlying invention is to be understood as offsetting a selected face from a 3D solid entity by expanding or condensing said solid entity.

In a first aspect the present invention provides a method for manipulating a computer aided design (CAD) model, comprising the following computer-implemented steps of:
creating a first solid entity in a CAD model, said first solid entity comprising one or more coordinates and a 3D volume;
a user executing a drag operation on said first solid entity;
wherein said drag operation comprises the following computer-implemented steps:
a) selecting a face of said first solid entity;
b) determining if said face is a major face or a minor face for said first solid entity;
c) determining a drag direction;
d) in case of a determined major face executing a moving operation on said first solid entity in said drag direction and in case of a determined minor face executing a push-pull operation on said selected face of said first solid entity in said drag direction.

It is advantageous as this greatly increases productivity by reducing the time taken to switch between a moving and a push-pull operation. One single drag operation enables to execute both operations in more convenient manner. In case of e.g. wall objects, often the user intends to move a wall when selecting the largest wall face, and when selecting a smaller side face intends to stretch or push-pull said face, making said wall wider or narrower. Said drag operation reduces time and clicks taken to provide or execute the correct operation on a solid object.

In a preferred embodiment said user can determine a drag distance for said drag operation.

In a preferred embodiment said drag distance is modified by mouse moving.

It is advantageous as it provides a more convenient and quick method of modifying the drag distance.

In a preferred embodiment a final drag distance is set by mouse clicking.

It is advantageous as it provides a more convenient and quick method of setting the drag distance.

In a preferred embodiment said drag distance can be manually changed by said user, preferably by manually entering a value for said drag distance.

It is advantageous as it provides more adaptability and accuracy in determining said drag distance.

In a preferred embodiment said drag direction is orthogonal to said selected face.

In a preferred embodiment said drag direction can be manually determined and/or changed by said user.

It is advantageous as it allows oblique extruding, etc.

In a preferred embodiment in case of a determined major face, said method further comprises:
e) by geometrical analysis determining existing faces of one or more neighboring solid entities adjacent to said first solid entity;
f) push-pulling said determined adjacent faces, which are not parallel to said drag direction, into said drag direction and over said determined drag distance.

Typically, connected or adjacent faces of other adjacent entities, need to stay connected or adjacent to each other. Said push-pulling of said adjacent entities with moving said first solid entity, allows a more automatic, quick and convenient method of moving an entity that needs to stay connected to other entities.

In a preferred embodiment major and minor faces are determined by:
grouping faces of said first solid entity in sets of parallel faces;

determining a score per face of said faces of said first solid entity;

per set determining the sum of the 2 best scoring faces;

determining the 2 best scoring faces of the set with the highest score sum as major, determining other faces as minor.

In a more preferred embodiment said score is based on face area, outer face circumference and/or manual input, preferably said score corresponds to the most outer face circumference.

It is advantageous as typically a user will want to move an entity when selecting a face with a more pronounced area, and typically will want to execute a push-pull operation when selecting a face with less pronounced area.

In a preferred embodiment a user executes a drag operation on multiple selected solid entities, whereby step a further comprises selecting one or more faces of one or more other solid entities of said CAD model, and whereby said drag operation is executed on said one or more selected faces of said one or more other solid entities.

This allows executing multiple drag operations at once, which improves productivity and decreases designing time for a user.

In a more preferred embodiment said drag direction is orthogonal to one of said one or more selected faces, preferably concerning the first selected face or a manually determined face.

In a preferred embodiment said method further comprises the following computer-implemented step:

a user assigning features to said first wall object.

The term "assigning features" in underlying invention is to be understood as that further details or specifications can be added to a solid entity. For example a wall can be assigned specific bricks, an opening for a window, etc. Typical application is 'Building Information Modeling' (BIM), which concerns digital representation of physical and functional characteristics of places, buildings, etc. Examples are columns, beams, slabs, walls, etc.

In a second aspect the present invention provides a computer program product for manipulating a computer aided design (CAD) model, said computer program product comprising at least one computer-readable storage medium having computer-readable program code portions stored therein, the computer-readable program code portions comprising instructions for:

creating a first solid entity in a CAD model, said first solid entity comprising one or more coordinates and a 3D volume;

a user executing a drag operation on said first solid entity;

wherein said drag operation comprises the following computer-implemented steps:

a) selecting a face of said first solid entity;

b) determining if said face is a major face or a minor face for said first solid entity;

c) determining a drag direction;

d) in case of a determined major face executing a moving operation on said first solid entity in said drag direction and in case of a determined minor face executing a push-pull operation on said selected face of said first solid entity in said drag direction.

In a third aspect the present invention provides a server for manipulating a computer aided design (CAD) model using a computing device connected to the server via a network, the server comprising:

an input receiving module, the input receiving module configured to receive user input for a drag operation on one or more solid entities in a CAD model set forth by the user;

at least one processor, the at least one processor configured to:

creating a first solid entity in a CAD model, said first solid entity comprising one or more coordinates and a 3D volume;

a user executing a drag operation on said first solid entity;

wherein said drag operation comprises the following computer-implemented steps:

a) selecting a face of said first solid entity;

b) determining if said face is a major face or a minor face for said first solid entity;

c) determining a drag direction;

d) in case of a determined major face executing a moving operation on said first solid entity in said drag direction and in case of a determined minor face executing a push-pull operation on said selected face of said first solid entity in said drag direction.

EXAMPLES

Figure 1:
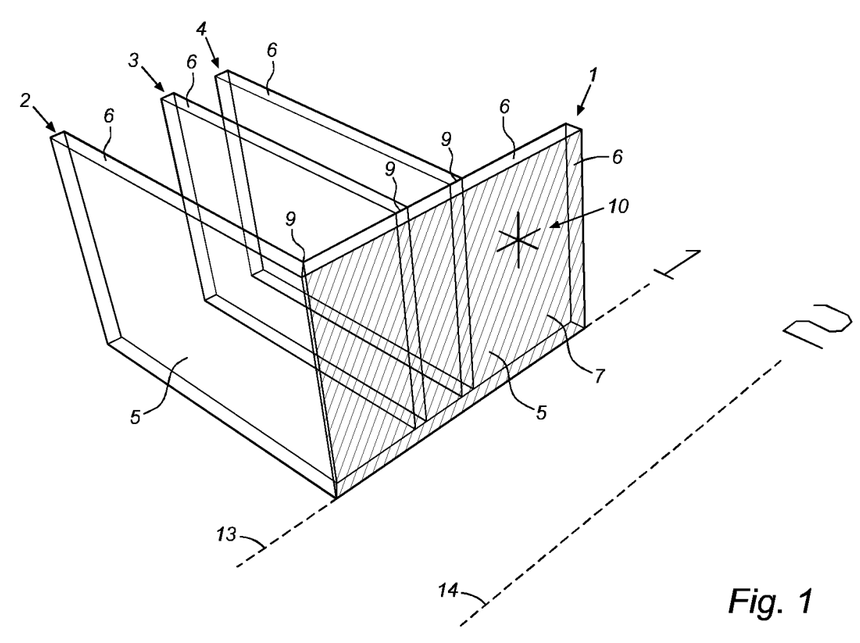
FIGS. 1-3 illustrate subsequent steps of manipulating a CAD 3D model layout in accordance with one embodiment of the invention.
Figure 2:
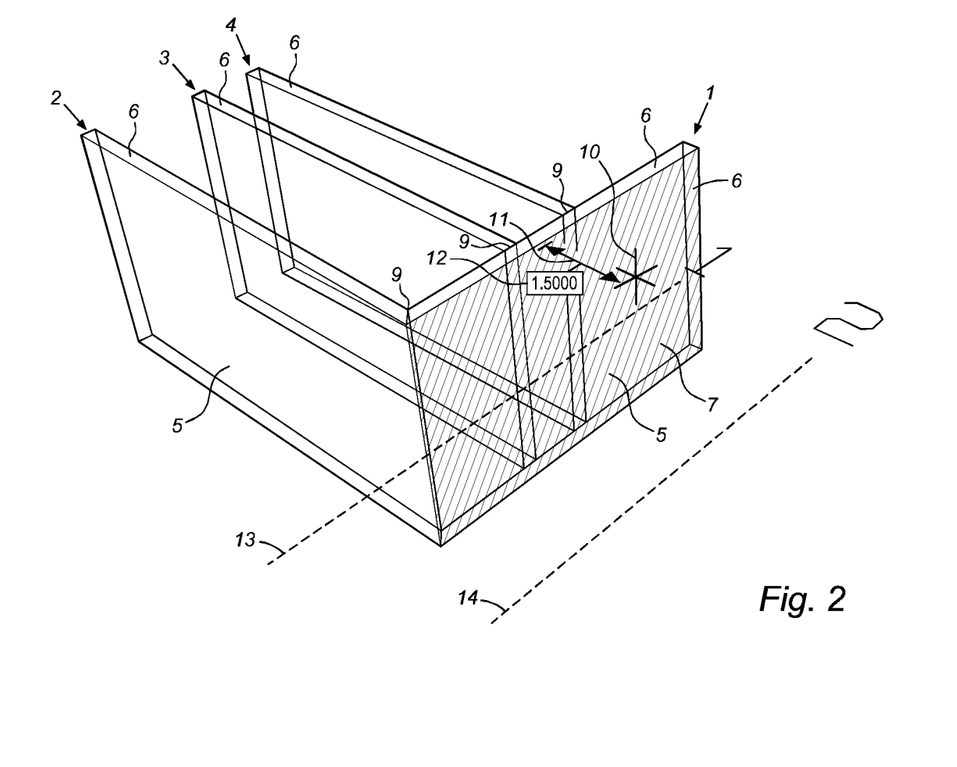
Figure 3:
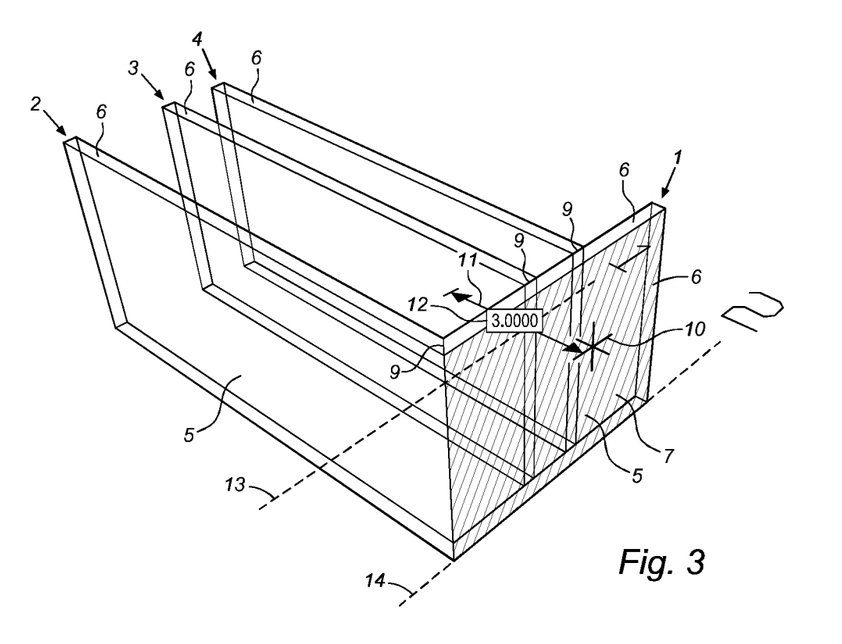

FIGS. 1-3 illustrate subsequent steps of manipulating a 3D CAD model layout in accordance with one embodiment of the invention.

FIG. 1 shows a 3D CAD model with three parallel vertical walls standing directly against another vertical wall, which walls are represented by solid entities (1-4). Solid entity (1) is connected to the three parallel solid entities (2), (3) and (4) by the adjacent faces (9). A solid entity comprises one or more coordinates and a 3D volume.

A user executes a drag operation on said first solid entity (1), starting with selecting face (7) of solid entity (1) with his cursor (10). Subsequently, it is determined if said face is a major face or a minor face for said solid entity (1). Major and minor faces are e.g. determined by first grouping the faces of said first solid entity (1) in sets of parallel faces, then determining the outer circumference per face of said solid entity (1). Per set, the sum of the 2 best scoring (cfr. outer circumference) faces is determined in order to find the 2 best scoring faces of the set with the highest score sum. These two best scoring faces are determined as major faces (5). The other faces of solid entity (1) are determined as minor faces (6). As a consequence selected face (7) is a major face together with the parallel face at the backside of entity (1), as these faces have the maximum outer circumference.

Because face (7) is a major face (5), a moving operation is executed on said solid entity (1). The drag or moving direction is orthogonal to said selected face (7). When the user moves the cursor (10) with his mouse, the drag distance is modified. FIG. 2 illustrates this with said solid entity (1) being moved away from the first position (13) over a drag distance of 1.5000.

The drag operation further comprises the determination of the adjacent faces (9) of the neighbouring solid entities (2), (3) and (4). As the user moves the cursor said determined adjacent faces (9) from solid entities (2), (3) and (4) are being push-pulled. Note that faces parallel to said drag direction, would not be manipulated. Said push-pulling or extending is executed synchronously with the moving operation, i.e. into the same drag direction and over the same drag distance. Hereby, adjacent faces (9) of the solid entities (2), (3) and (4) retain adjacent faces (9) of solid entity (1).

FIG. 3 illustrates said user further moving the cursor (10) away from the first position (13). The final drag distance is set by clicking the mouse, which is 3.0000, corresponding to said solid entity (1) being moved to the second position (14).

The drag distance can be manually changed by the user, by entering or amending a value for said drag distance into the text box (12), which is displayed together with the double arrow (11) while executing said drag operation.

Figure 4:
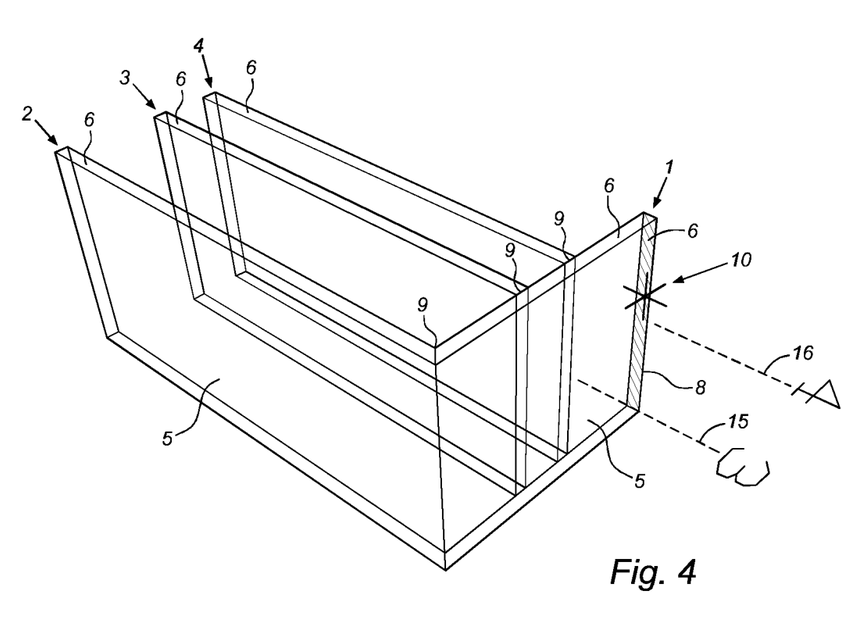
FIGS. 4-6 illustrate subsequent steps of manipulating the CAD 3D model layout from FIGS. 1-3.
Figure 5:
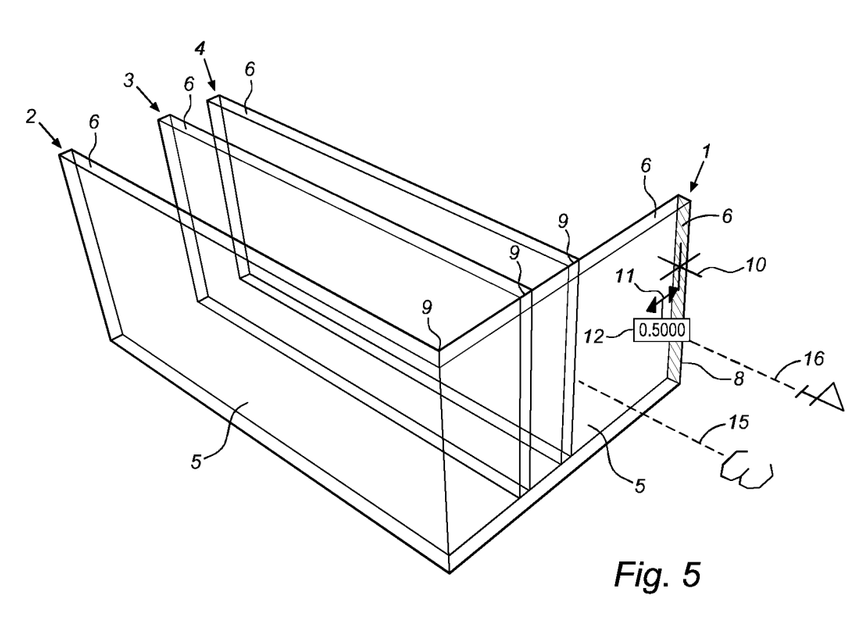
Figure 6:
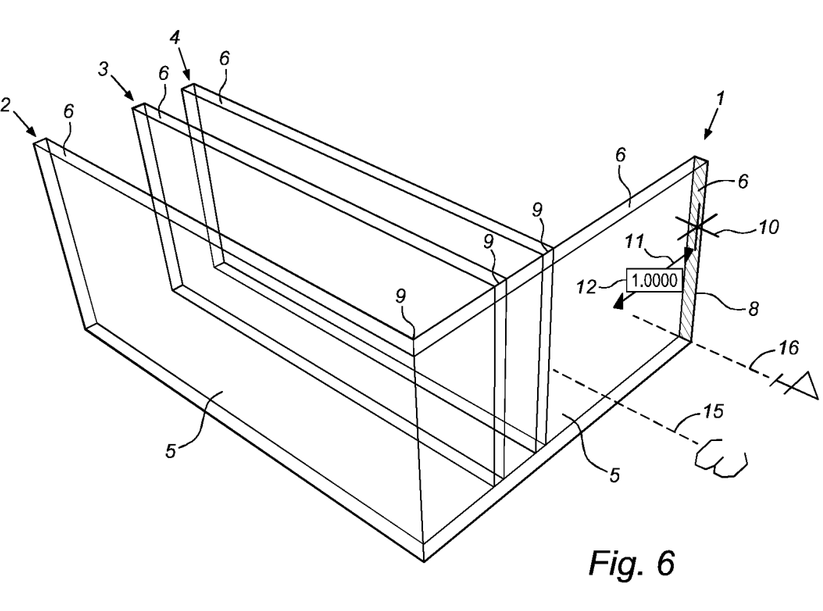

FIGS. 4-6 illustrate subsequent steps of manipulating the CAD 3D model layout from FIGS. 1-3.

FIG. 4 shows said 3D CAD model from FIG. 3. Solid entity (1) is still connected to the three parallel and extended solid entities (2), (3) and (4) by the adjacent faces (9).

The user executes another drag operation on said first solid entity (1), starting with selecting face (8) of solid entity (1) with his cursor (10). It is determined if said face is a major face (5) or a minor face (6) for said solid entity (1). Selected face (8) is determined as a minor face (6) based on outer circumference.

Because selected face (8) is a minor face (6), a push-pull operation is executed on said solid entity (1). The drag or push-pulling direction is orthogonal to said selected face (8). When the user moves the cursor (10) with his mouse, the drag distance is modified. FIG. 5 illustrates this with said solid entity (1) being extended away from the third position (15) over a drag distance of 0.5000.

FIG. 6 illustrates said user further moving the cursor (10) away from the third position (13). The final drag distance is set by clicking the mouse, which is 1.0000, corresponding to said solid entity (1) being extended or push-pulled to the fourth position (16).

The drag distance can be manually changed by the user, by entering or amending a value for said drag distance into the text box (12), which is displayed together with the double arrow (11) while executing said drag operation.

Figure 7:
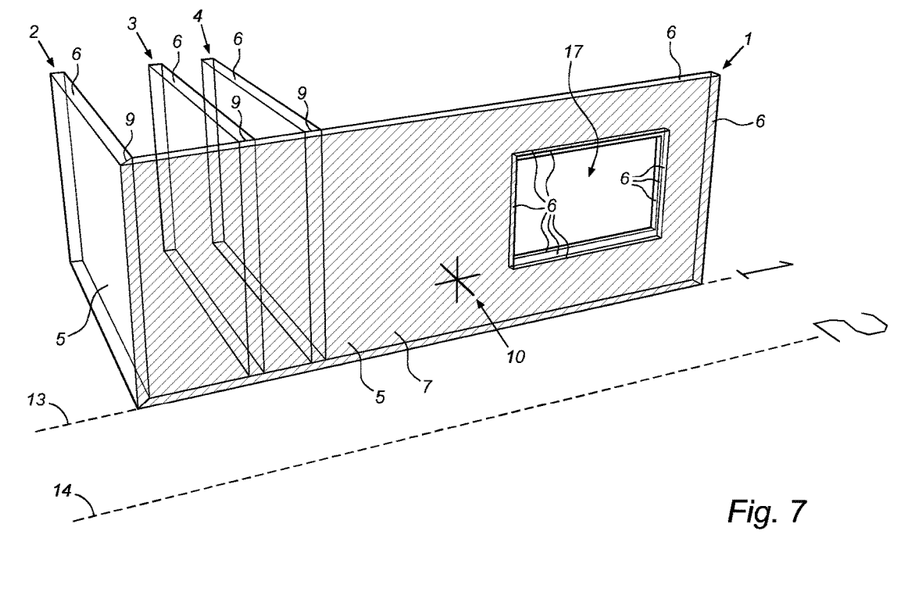
FIGS. 7-9 illustrate subsequent steps of manipulating a CAD 3D model layout in accordance with one embodiment of the invention.
Figure 8:
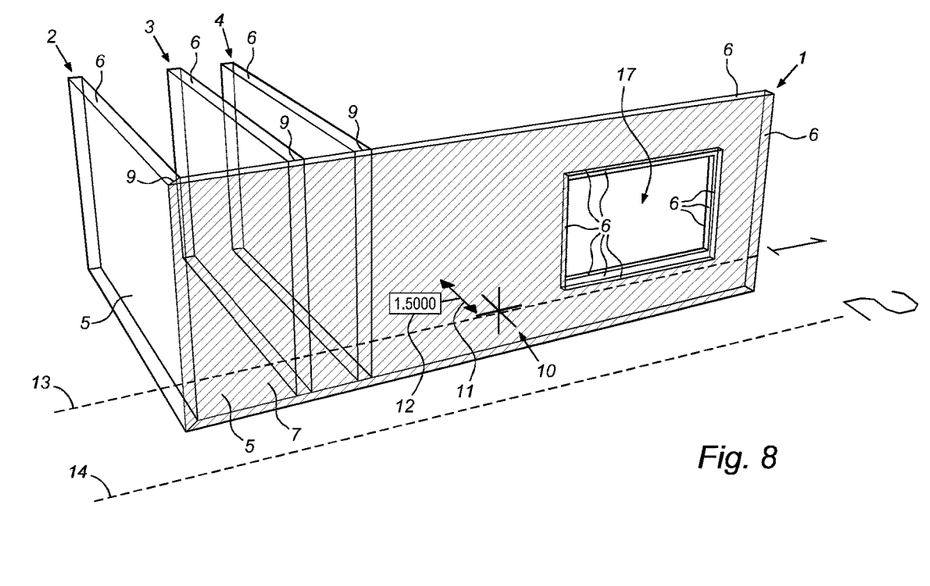
Figure 9:
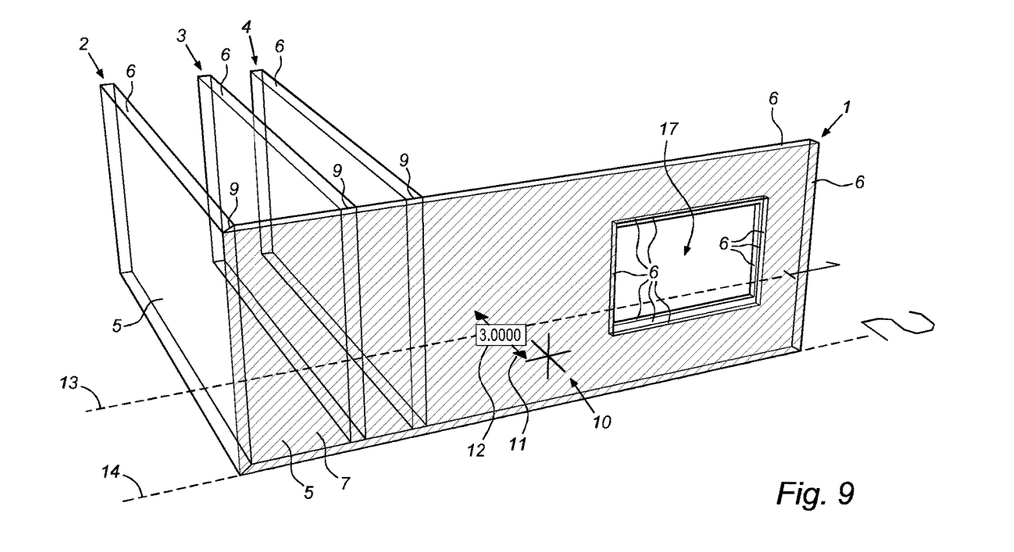

FIGS. 7-9 illustrate subsequent steps of manipulating a CAD 3D model layout in accordance with one embodiment of the invention.

FIG. 7 shows a 3D CAD model with three parallel vertical walls standing directly against another vertical wall, which walls are represented by solid entities (1-4). Solid entity (1) is connected to the three parallel solid entities (2), (3) and (4) by the adjacent faces (9). Solid entity (1) comprises an opening (17), cfr. a window opening, wherein the size of said opening at the selected face (7) is larger than at the back face.

A user executes a drag operation on said first solid entity (1), starting with selecting face (7) of solid entity (1) with his cursor (10). Subsequently, it is determined if said face is a major face or a minor face for said solid entity (1). Major and minor faces are e.g. determined by first grouping the faces of said first solid entity (1) in sets of parallel faces, then determining the outer circumference per face of said solid entity (1). Per set, the sum of the 2 best scoring (cfr. outer circumference) faces is determined in order to find the 2 best scoring faces of the set with the highest score sum. These two best scoring faces are determined as major faces (5). All other faces of solid entity (1) are determined as minor faces (6), including the interior faces constructing said opening (17). As a consequence selected face (7) is a major face together with the parallel face at the backside of entity (1), as these faces have the maximum outer circumference.

Because face (7) is a major face (5), a moving operation is executed on said solid entity (1). The drag or moving direction is orthogonal to said selected face (7). When the user moves the cursor (10) with his mouse, the drag distance is modified. FIG. 8 illustrates this with said solid entity (1) being moved away from the first position (13) over a drag distance of 1.5000.

The drag operation further comprises the determination of the adjacent faces (9) of the neighbouring solid entities (2), (3) and (4). As the user moves the cursor said determined adjacent faces (9) from solid entities (2), (3) and (4) are being push-pulled. Note that faces parallel to said drag direction, would not be manipulated. Said push-pulling or extending is executed synchronously with the moving operation, i.e. into the same drag direction and over the same drag distance. Hereby, adjacent faces (9) of the solid entities (2), (3) and (4) retain adjacent faces (9) of solid entity (1).

FIG. 9 illustrates said user further moving the cursor (10) away from the first position (13). The final drag distance is set by clicking the mouse, which is 3.0000, corresponding to said solid entity (1) being moved to the second position (14).

The drag distance can be manually changed by the user, by entering or amending a value for said drag distance into the text box (12), which is displayed together with the double arrow (11) while executing said drag operation.

Although the present invention has been described with reference to preferred embodiments thereof, many modifications and alternations may be made by a person having ordinary skill in the art without departing from the scope of this invention which is defined by the appended claims.

REFERENCE NUMBERS

1) First solid entity
2) Second solid entity
3) Third solid entity
4) Fourth solid entity
5) Major face
6) Minor face
7) Selected major face
8) Selected minor face
9) Adjacent face
10) Cursor
11) Drag distance arrow
12) Drag distance text box
13) First position
14) Second position
15) Third position
16) Fourth position
17) Opening (e.g. window opening in a wall)

What is claimed is:

1. Method for manipulating a computer aided design model, comprising the following computer-implemented steps:
  creating a first solid entity in a computer aided design model, said first solid entity comprising one or more coordinates and a 3D volume;
  a user executing a drag operation on said first solid entity;
  wherein said drag operation comprises the following computer-implemented steps:
   a) selecting a face of said first solid entity;
   b) determining if said face is a major face or a minor face for said first solid entity;
   c) determining a drag direction;
   d) in case of a determined major face executing a moving operation on said first solid entity in said drag direction and in case of a determined minor face executing a push-pull operation on said selected face of said first solid entity in said drag direction, wherein major and minor faces are determined by:
grouping faces of said first solid entity in sets of parallel faces;
determining a score per face of said faces of said first solid entity;
per set determining the sum of the two best scoring faces;
determining the two best scoring faces of the set with the highest score sum as major, determining other faces as minor.

2. The method according to claim 1, wherein said user can determine a drag distance for said drag operation.

3. The method according to claim 2, wherein said drag distance is modified by mouse moving.

4. The method according to claim 2, wherein a final drag distance is set by mouse clicking.

5. The method according to claim 2, wherein said drag distance can be manually changed by said user, by manually entering a value for said drag distance.

6. The method according to claim 2, wherein said method in case of a determined major face, further comprises:
e) by geometrical analysis determining existing faces of one or more neighboring solid entities adjacent to said first solid entity;
f) push-pulling said determined adjacent faces, which are not parallel to said drag direction, into said drag direction and over said determined drag distance.

7. The method according to claim 1, wherein said drag direction is orthogonal to said selected face.

8. The method according to claim 1, wherein said drag direction can be manually determined and/or changed by said user.

9. The method according to claim 1, wherein said score is based on face area, outer face circumference and/or manual input.

10. The method according to claim 1, wherein a user executes a drag operation on multiple selected solid entities, wherein step a) further comprises selecting one or more faces of one or more other solid entities of said computer aided design model, and wherein said drag operation is executed on said one or more selected faces of said one or more other solid entities.

11. The method according to claim 10, wherein said drag direction is orthogonal to one of said one or more selected faces, concerning the first selected face or a manually determined face.

12. The method according to claim 1, further comprising the step of:
a user assigning features to said first solid entity.

13. The method according to claim 1, wherein said score corresponds to the most outer face circumference.

14. A computer program product for manipulating a computer aided design model, said computer program product comprising at least one tangible non-transitory computer-readable storage medium having computer-readable program code portions stored therein, the computer-readable program code portions comprising instructions for:
creating a first solid entity in a computer aided design model, said first solid entity comprising one or more coordinates and a 3D volume;
a user executing a drag operation on said first solid entity;
wherein said drag operation comprises the following computer-implemented steps:
a) selecting a face of said first solid entity;
b) determining if said face is a major face or a minor face for said first solid entity;
c) determining a drag direction;
d) in case of a determined major face executing a moving operation on said first solid entity in said drag direction and in case of a determined minor face executing a push-pull operation on said selected face of said first solid entity in said drag direction,
wherein major and minor faces are determined by:
grouping faces of said first solid entity in sets of parallel faces;
determining a score per face of said faces of said first solid entity;
per set determining the sum of the two best scoring faces;
determining the two best scoring faces of the set with the highest score sum as major, determining other faces as minor.

15. The computer program product of claim 14, wherein the computer-readable code portions comprise instructions for determining a drag distance for said drag operation by a user, and wherein said drag operation in case of a determined major face further comprises the following computer-implemented steps:
e) by geometrical analysis determining existing faces of one or more neighboring solid entities adjacent to said first solid entity;
f) push-pulling said determined adjacent faces, which are not parallel to said drag direction, into said drag direction and over said determined drag distance.

16. The computer program product according to claim 14, wherein the computer-readable program code portions comprise instructions for executing a drag operation on multiple selected solid entities by a user, whereby step a) further comprises selecting one or more faces of one or more other solid entities of said computer aided design model, and wherein said drag operation is executed on said one or more selected faces of said one or more other solid entities.

17. A server for manipulating a computer aided design model using a computing device connected to the server via a network, the server comprising:
an input receiving module, the input receiving module configured to receive user input for a drag operation on one or more solid entities in a computer aided design model set forth by the user;
at least one processor, the at least one processor:
creating a first solid entity in a computer aided design model, said first solid entity comprising one or more coordinates and a 3D volume;
a user executing a drag operation on said first solid entity;
wherein said drag operation comprises the following computer-implemented steps:
a) selecting a face of said first solid entity;
b) determining if said face is a major face or a minor face for said first solid entity;
c) determining a drag direction;
d) in case of a determined major face executing a moving operation on said first solid entity in said drag direction and in case of a determined minor face executing a push-pull operation on said selected face of said first solid entity in said drag direction,
wherein major and minor faces are determined by:
grouping faces of said first solid entity in sets of parallel faces;
determining a score per face of said faces of said first solid entity;
per set determining the sum of the two best scoring faces;

determining the two best scoring faces of the set with the highest score sum as major, determining other faces as minor.

18. The server of claim 17, wherein the user input comprises a drag distance for said drag operation, and wherein said drag operation in case of a determined major face further comprises the following computer-implemented steps:
   e) by geometrical analysis determining existing faces of one or more neighboring solid entities adjacent to said first solid entity;
   f) push-pulling said determined adjacent faces, which are not parallel to said drag direction, into said drag direction and over said determined drag distance.

19. The server of claim 17, wherein the at least one processor is configured for executing a drag operation on multiple selected solid entities by a user, wherein step a) further comprises selecting one or more faces of one or more other solid entities of said computer aided design model, and wherein said drag operation is executed on said one or more selected faces of said one or more other solid entities.

\* \* \* \* \*